United States Patent [19]

Murayama et al.

[11] 4,257,069
[45] Mar. 17, 1981

[54] DATA COMPRESSION APPARATUS

[75] Inventors: Noboru Murayama; Hayashi Taniguchi, both of Tokyo, Japan

[73] Assignee: Ricoh Company, Ltd., Tokyo, Japan

[21] Appl. No.: 916,906

[22] Filed: Jun. 19, 1978

[30] Foreign Application Priority Data

Jun. 29, 1977 [JP] Japan .................................. 52-77625

[51] Int. Cl.³ .............................................. H04N 1/00
[52] U.S. Cl. ..................................... 358/261; 364/515
[58] Field of Search ..................... 358/260, 261, 133; 364/515; 340/347 DD

[56] References Cited
FOREIGN PATENT DOCUMENTS 1440378  6/1976  United Kingdom ..................... 358/261

*Primary Examiner*—Robert L. Griffin
*Assistant Examiner*—Edward L. Coles
*Attorney, Agent, or Firm*—David G. Alexander

[57] ABSTRACT

Correlation between data in two adjacent scan lines is sensed. When the degree of correlation is above a predetermined value the data is compressed by means of two dimensional compression. When the degree of correlation is below the predetermined value the data is compressed by means of one dimensional compression. Typically, both the one and two dimensional compression systems are based on run length encoding. After a predetermined number of scan lines have been compressed by two dimensional compression, one scan line may be compressed by one dimensional compression to prevent accumulation of error.

20 Claims, 9 Drawing Figures

DATA COMPRESSION APPARATUS

BACKGROUND OF THE INVENTION

The present invention relates to a data compression apparatus for a facsimile system or the like.

In a facsimile system an original document is opto-electronically scanned to produce binary data signals representing light and dark areas of the document. These data signals are transmitted to a remote receiver over a telephone line or the like. The receiver reproduces the original document based on the received data signals.

In most cases the data signals contain a high degree of redundancy. Especially in the case of a white sheet of paper containing only a few characters or designs, the white background areas constitute mostly redundant data.

It is always desirable to increase the transmission speed in facsimile systems. Not only can more documents be transmitted in a given period of time, but the transmission time per document is reduced. Especially where facsimile transmission is performed via overseas telephone lines, it is desirable to reduce the transmission time and thereby the telephone charges.

Compressing the data signals so as to reduce the degree of redundancy provides an advantageous way of increasing transmission speed. Typical of such compression methods is run length encoding in which the data signals themselves are not transmitted. Instead, the numbers of consecutive data signals of the same logical value (representing black or white areas of the document) are counted and codes corresponding to these counts are transmitted. For example, if a data run consisting of 9 consecutive logically low (white area) bits is counted, the binary code 1001 may be transmitted. Although codes indicating whether the run lengths are for high or low bits may also be transmitted, such codes are redundant in that runs of logically low bits must necessarily follow runs of logically high bits and vice-versa.

In one dimensional run length data compression, the data runs are limited to one scan line. In other words, one scan line is run length encoded, the process interrupted, and then the next scan line is encoded. Even if a data run extends from one scan line to another, the scan lines are separated.

Although one dimensional compression demonstrates a very low error rate, the degree of compression or the compression ratio is rather limited.

The one dimensional compression process may be extended to a two dimensional compression process know as batch encoding in which a predetermined number of scan lines are encoded in a batch. In this case, runs may extend between lines in the batch.

A third type of data compression is known as sequential two dimensional processing in which the vertical correlation between each two adjacent scan lines is taken into account to further reduce the redundancy and increase the degree of compression. Generally, for documents containing a large amount of blank spaces sequential two dimensional compression provides a compression ratio which is 1.2 to 2 times greater than for one dimensional compression. However, for complicated patterns where there is little or no correlation between adjacent scan lines, the compression ratio with sequential two dimensional compression is lower than that with one dimensional compression.

Another problem inherent in two dimensional data compression is that the effects of a data error tend to be passed on to subsequent scan lines. In two dimensional batch processing, the extension of error is limited to the number of scan lines in the batch.

A prior art attempt to prevent the propogation of error in sequential two dimensional compression involves automatically subjecting every fourth scan line, for example, to one dimensional rather than two dimensional compression. Although this expedient does succeed in limiting propogation of error to four scan lines, it also seriously deteriorates the overall compression ratio of the system.

SUMMARY OF THE INVENTION

In accordance with the present invention a data compression apparatus for compressing data representing a plurality of scan lines comprises a one dimensional compression means, a two dimensional compression means and sensing means for sensing a degree of correlation between data in a scan line and a preceding scan line.

Control means responsive to the sensing means control the two dimensional compression means to perform two dimensional data compression on the data in said scan line when the degree of correlation between the data in said scan line and said preceding scan line is above a predetermined value. The control means controls the one dimensional scan means to perform one dimensional data compression on the data in said scan line when the degree of correlation between the data in said scan line and said preceding scan line is below the predetermined value.

It is an object of the present invention to provide a data compression apparatus which demonstrates a superior degree of compression regardless of the pattern of data being compressed.

It is another object of the present invention to provide a data compression apparatus which limits propogation of error encountered in two dimensional compression.

It is another object of the present invention to provide a generally improved data compressing apparatus.

Other objects, together with the foregoing, are attained in the embodiments described in the following description and illustrated in the accompanying drawing.

DESCRIPTION OF THE PREFERRED EMBODIMENTS

While the data compression apparatus of the present invention is susceptible of numerous physical embodiments, depending upon the environment and requirements of use, substantial numbers of the herein shown and described embodiments have been made, tested and used, and all have performed in an eminently satisfactory manner.

Figure 2:
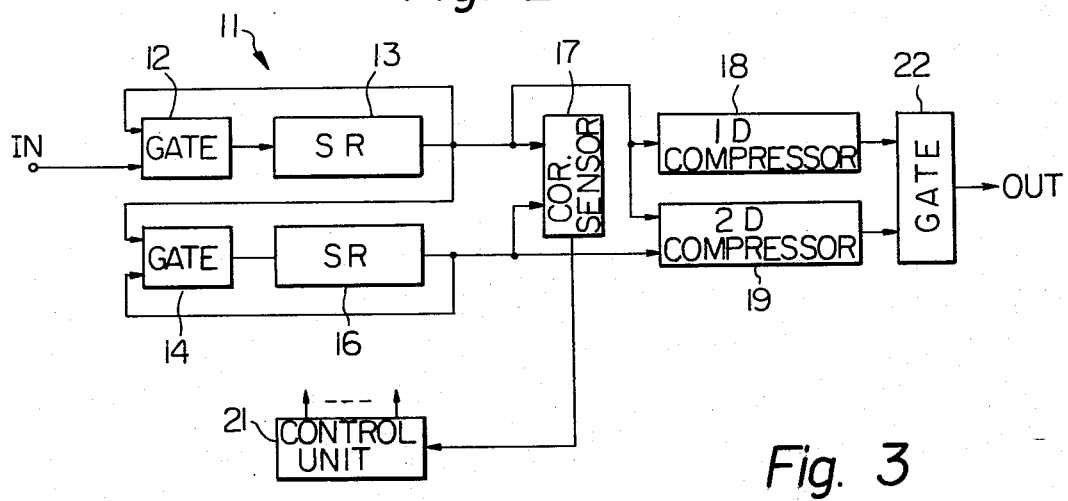
FIG. 2 is a block diagram of a data compression apparatus embodying the present invention.

Referring now to FIG. 2 of the drawing, a data compression apparatus embodying the present invention is generally designated by the reference numeral 11 and comprises an input gate 12 through which data from a scanner or the like of a facsimile system (not shown) is gated into a shift register 13. The output of the shift register 13 is connected through another input gate 14 to the input of another shift register 16.

Although the scanner is not shown, it scans an original document which is likewise not shown to produce binary electrical data signals representing the black and white areas of the document. The scanner scans the document in an orthogonal pattern of horizontal scan lines. Each scan line contains a predetermined number of data signals. Each of the shift registers 13 and 16 has the capacity to store one scan line. The data in the shaft registers 13 and 16 may be recirculated therethrough through the gates 12 and 14 respectively since the outputs of the shift registers 13 and 16 are connected to other inputs of the gates 12 and 14.

The outputs of the shift registers 13 and 16 are connected to inputs of a correlation sensor 17 which senses correlation between the data in a current scan line and a preceding scan line. The output of the shift register 13 is also connected to inputs of a one dimensional data compressor 18 and a two dimensional data compressor 19. The output of the shift register 16 is connected to another input of the compressor 19. A control output of the correlation sensor 17 is connected to a control unit 21 which controls the overall operation of the apparatus 11. Outputs of the compressors 18 and 19 are connected to inputs of an output gate 22, the output of which constitutes the output of the apparatus 11.

The data compressor 18 is constructed to perform one dimensional data compression on the data from the shift register 13. Typically, the compression process utilized by the compressor 18 is one dimensional run length encoding, although the present invention is not so limited.

The data compressor 19 is constructed to perform two dimensional data compression on the data from the shift register 13, taking into account the correlation between the data in the shift registers 13 and 16. Typically, the compression process utilized by the compressor 19 is two dimensional sequential encoding, although two dimensional batch encoding or any other suitable two dimensional compression method may be used.

In operation, the data of a scan line is fed through the gate 12 into the shift register 13. In this case, the gate 12 accepts the input data and rejects the data applied thereto from the output of the shift register 13. Then, the next scan line is fed into the shift register 13 while the first scan line is shifted through the gate 14 into the shift register 16. It will thus be understood that where the second scan line is considered to be a current scan line and the first scan line is considered to be a preceding scan line, the current scan line is stored in the shift register 13 whereas the preceding scan line is stored in the shift register 16.

After storage of the two scan lines in the registers 13 and 16, the registers 13 and 16 are shifted to recirculate the data therethrough once. The gates 12 and 14 are controlled to accept the data fed thereto from the outputs of the shift registers 13 and 16 respectively. During this operation, the data signals in the shift registers 13 and 16 are sequentially applied to the inputs of the correlation sensor 17.

The sensor 17 senses the data applied thereto and determines the correlation between the data in the current scan line and the preceding scan line. When the degree of correlation is above a predetermined value, the sensor 17 produces a logically high output which is applied to the control unit 21 which controls the gate 22 to accept the output of the two dimensional compressor 19.

Then, the data is recirculated through the shift registers 13 and 16 one more. This time, the data applied to the compressor 19 is compressed and passed through the gate 22 to a transmission line such as a telephone line or the like (not shown) for transmission to a remote receiver.

After the current scan line is compressed and output in the manner described, the next scan line is fed into the shift register 13 and the previously current scan line shifted into the shift register 16 to constitute a new preceding scan line. Then, the correlation sensing process and the compression process is repeated for the new current scan line in the shift register 13. These steps are repeatedly performed until all scan lines of the document are compressed.

Assuming that the degree of correlation sensed by the sensor 17 is below the predetermined value, the sensor 17 produces a logically low output signal which controls the gate 22 to accept the output of the one dimensional compressor 18. In other words, when the degree of correlation, or correlation coefficient between the current scan line and the preceding scan line is sufficiently high that a higher compression ratio is attainable with two dimensional compression, the output of the two dimensional compressor 19 is selected. On the other hand, when the correlation coefficient is so low, as which often occurs in the case of an ordinary typewritten document, that a higher compression ratio is attainable with one dimensional compression, the output of the one dimensional compressor 18 is selected.

The control unit 21 is also preferably constructed to count the logically high signals from the sensor 17, which indicate the two dimensional compression process being selected for respective scan lines, and select the one dimensional compression process for one scan line after a predetermined number of consecutive preceding scan lines have been compressed in the two dimensional mode. This positively limits the propogation of error which may occur where the two dimensional compression process is repeated for a large number of consecutive scan lines.

Thus, it will be seen that present apparatus 11 achieves a maximum degree of data compression regardless of the pattern of the data representing an original document, and also positively prevents propogation of error through succeeding scan lines.

Figure 3:
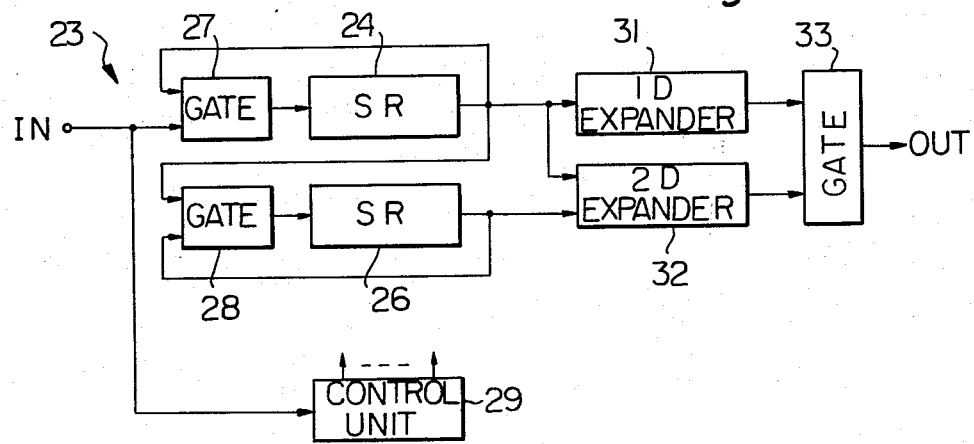
FIG. 3 is a block diagram of data expansion apparatus embodying the present invention for expanding the compressed data.

A data expansion apparatus 23 for expanding the data compressed by the apparatus 11 is shown in FIG. 3 and comprises shift registers 24 and 26 and input gates 27 and 28 identical to the shift registers 13 and 16 and the gates 12 and 14 respectively of the apparatus 11. Although not illustrated, the control unit 21 of the apparatus 11 is operative to insert a code indicating one dimensional or two dimensional compression at the head of the compressed data of each scan line. This code is sensed by a control unit 29 of the apparatus 23. The output of the shift register 24 is applied to inputs of a one dimensional data expander 31 and a two dimensional data expander 32, outputs of which are connected to inputs of an output gate 33. The output of the gate 33 constitutes the output of the apparatus 23. An output of the shift register 26 is connected to another input of the expander 32.

In operation, the current scan line and the preceding scan line are stored in the shift registers 24 and 26 respectively in the same manner as in the apparatus 11. The control unit 29 senses the code for one dimensional or two dimensional compression and controls the gate 33 to select the output of the expander 31 or the expander 32 respectively in response thereto. Then, the data is recirculated through the shift registers 24 and 26 and applied to the expanders 31 and 32. The expanded data is output through the gate 33. In the case of one dimensional expansion, the expander 31 operates only on the data in the current scan line. However, for two dimensional expansion, the expander 32 senses the data in the preceding scan line and takes it into account while expanding the data in the current scan line.

Numerous methods may be applied to determine the degree of correlation of correlation coefficient, which will be herebelow designated as r. Six methods which have been found advantageous for the present apparatus will be described.

FIRST METHOD

Figure 4:
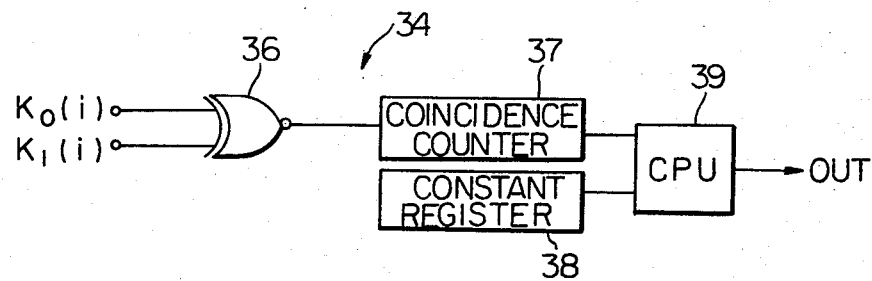
FIG. 4 is a block diagram of a first correlation sensing unit of the present invention.

A sensor 34 which may be utilized as the sensor 17 in the apparatus 11 is shown in FIG. 4. The sensor 34 comprises an exclusive NOR gate 36 to which the outputs of the shift registers 13 and 16 are applied. The output of the shift register 13 for the ith data signal in the current scan line is designated as $K_0(i)$. Similarly, the output of the shift register 16 for the ith data signal in the preceding scan line is designated as $K_1(i)$. In other words, the data signals $K_0(i)$ and $K_1(i)$ are in the same position in the current and preceding scan lines respectively.

The output of the exclusive NOR gate 36 is connected to the input of a coincidence counter 37, the output of which is connected to a central processing unit (CPU) 39 which may advantageously be embodied by an integrated circuit micro or mini processor. The output of a constant register 38 is also connected to the CPU 39.

The CPU 39 determines the correlation coefficient r as follows:

$$r = \frac{\text{number of correlated data} - \text{number of uncorrelated data}}{\text{total number of data}}$$

Data correlation is considered to occur where a data in the current scan line is logically identical to the data in the corresponding position in the preceding scan line. Thus, the number of correlated data is the number of data in the current scan line for which such correlation occurs. The number of uncorrelated data is the number of data in the current scan line for which such correlation does not occur.

The exclusive NOR gate 36 acts as a coincidence detector since it produces a high output only when the signals $K_0(i)$ and $K_1(i)$ are both high or are both low. The coincidence counter 37 counts the number of coincident or correlated data. The CPU 39 computes the correlation coefficient r in accordance with either of the following equations.

$$r = 1 - \frac{2}{n} \sum_{i=1}^{n} | K_0(i) - K_1(i) | \quad (1)$$

$$r = 1 - \frac{2}{n} \sum_{i=1}^{n} (K_0(i) - K_1(i))^2 \quad (2)$$

In this case, n represents the number of data signals in each scan line and is stored in the register 38. The CPU 39 produces a high or low output signal depending on whether the correlation coefficient r is above or below the predetermined value respectively.

SECOND METHOD

Figure 5:
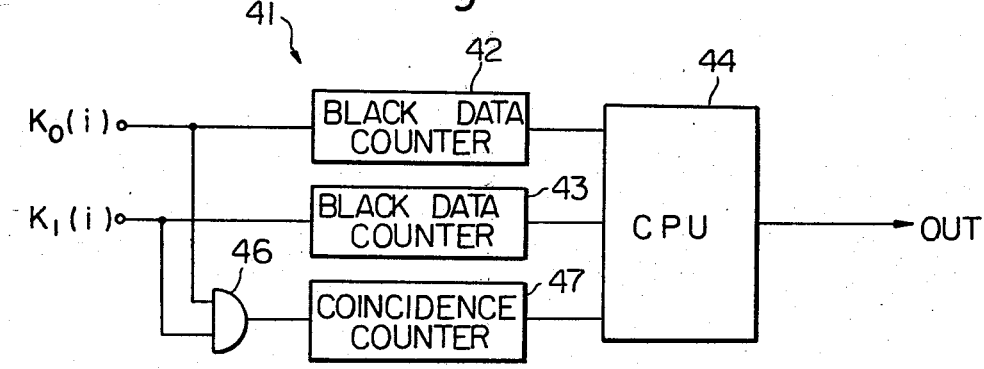
FIG. 5 is a block diagram of a second correlation sensing unit of the present invention.

A sensor 41 for embodying the second method is illustrated in FIG. 5 and comprises black data counters 42 and 43, the outputs of which are connected to a CPU 44. The signals $K_0(i)$ are applied to the counter 42 whereas the signals $K_1(i)$ are applied to the counter 43. The counters 42 and 43 count the numbers of logically high data signals in the current and preceding scan lines respectively which represent dark or black areas of the document.

The signals $K_0(i)$ and $K_1(i)$ are also applied to inputs of an AND gate 46, the output of which is connected to an input of a coincidence counter 47. The output of the coincidence counter 47 is connected to the CPU 44. The AND gate 46 detects coincident or correlated data and the coincidence counter 47 counts the number of correlated data.

The CPU 44 computes the correlation coefficient r as follows:

$$r = \frac{\left\{ \sum_{i=1}^{n} K_0(i) \cdot K_1(i) - \frac{1}{n} \sum_{i=1}^{n} K_0(i) \cdot \sum_{i=1}^{n} K_1(i) \right\}}{\sqrt{\left( \sum_{i=1}^{n} K_0(i)^2 - \sum_{i=1}^{n} K_0(i)^2/n \right) \left( \sum_{i=1}^{n} K_1(i)^2 - \sum_{i=1}^{n} K_1(i)^2/n \right)}} \quad (3)$$

In order to prevent the numerator or denominator from becoming zero, the following constraints are imposed:

$$\begin{cases} K_0 = 1 + \sum_{i=1}^{n} K_0(i), K_1 = 1 + \sum_{i=1}^{n} K_1(i) \\ C(11) = 1 + \sum_{i=1}^{n} K_0(i) \cdot K_1(i) \end{cases}$$

Equation (3) may in this manner be rewritten as follows:

$$r = \frac{|C(11) - \frac{1}{n} K_0 \cdot K_1|}{\sqrt{K_0 \cdot K_1 \left(1 - \frac{K_0}{n}\right) \left(1 - \frac{K_1}{n}\right)}} \quad (4)$$

THIRD METHOD

Figure 6:
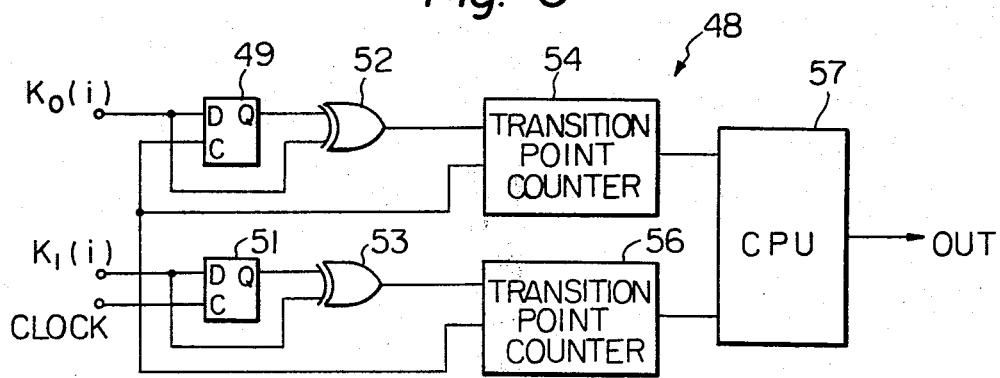
FIG. 6 is a block diagram of a third correlation sensing unit of the present invention.

A sensor 48 for embodying the third method of determining the correlation coefficient r is illustrated in FIG. 6 and comprises D-type flip-flops 49 and 51, the Q outputs of which are connected to inputs of exclusive OR gates 52 and 53 respectively. The signals $K_0(i)$ and $K_1(i)$ are applied to the D inputs of the flip-flops 49 and 51 and also to other inputs of the exclusive OR gates 52 and 53 respectively. The outputs of the exclusive OR gates 52 and 53 are connected to transition point counters 54 and 56 respectively, the outputs of which are connected to a CPU 57. System clock pulses are applied to the clock inputs of the flip-flops 49 and 51 and counters 54 and 56.

The sensor 48 does not determine the correlation coefficient r through direct sensing of the data signals but instead detects and counts transition points. These transition points mark the end of one run length and the beginning of the next run length and occur at high to low transitions and low to high transitions. The flip-flops 49 and 51 serve to delay the input data by one bit. Thus, while a current data signal $K_0(i)$ is applied directly to the exclusive OR gate 52, the preceding data signal $K_0(i-1)$ is applied to the exclusive OR gate 52 from the Q output of the flip-flop 49. The operation of the flip-flop 51 is identical for the data signals $K_1(i)$.

If the current and preceding data signals are different, indicating a transition point, the exclusive OR gates 52 and 53 produce high outputs which are counted by the counters 54 and 56. In this manner, the counter 54 counts the number of transition points in the current scan line and the counter 56 counts the number of transition points in the preceding scan line.

The correlation coefficient r is determined as follows:

$$r = 1 - \frac{\text{DIFFERENCE}}{\text{SUM}} \quad (5)$$

DIFFERENCE is the difference between the numbers of transition points in the current scan line and preceding scan line and SUM is the sum of the transition points in the current scan line and preceding scan line. The computation may be made, assuming that to prevent the numerator or denominator from becoming zero each scan line comprises at least one transition point at the end thereof, using either of the following equations:

$$r = 1 + \sum_{i=1}^{n} |K_0(i) - K_0(i+1)| \quad (6)$$

$$r = 1 + \sum_{i=1}^{n} (K_0(i) - K_0(i+1))^2 \quad (7)$$

The above equation (5) may be also considered as follows:

$$\bar{r} = \frac{\text{DIFFERENCE}}{\text{SUM}}$$

In this case $\bar{r}$ may be considered as representing the degree of non-correlation. An apparatus embodying the coefficient $\bar{r}$ is simplified since a subtraction operation is eliminated.

FOURTH METHOD

Figure 7:
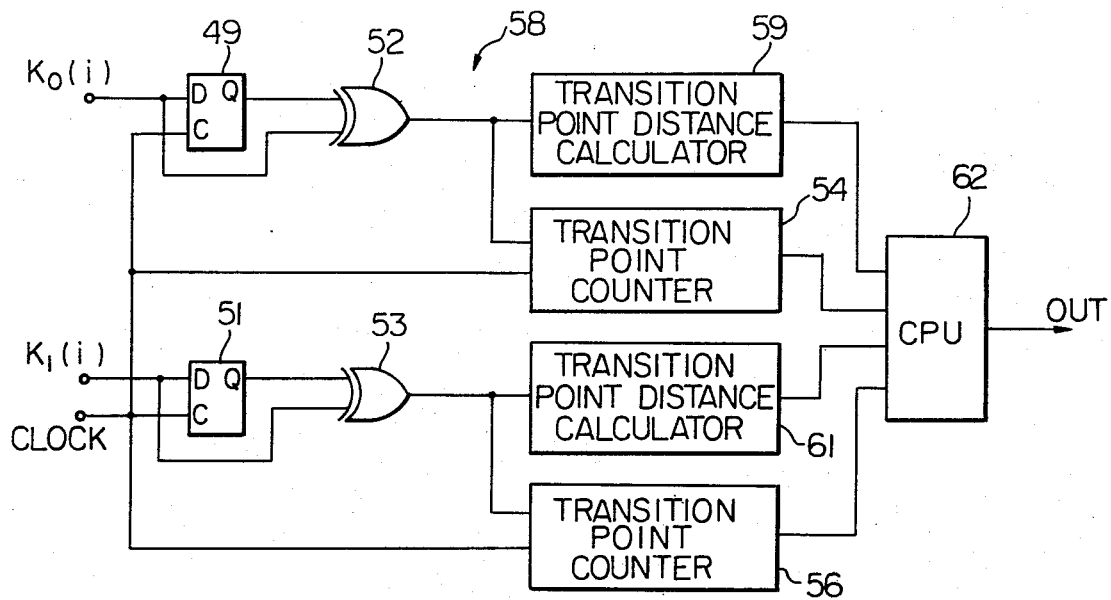
FIG. 7 is a block diagram of a fourth correlation sensing unit of the present invention.
Figure 8:
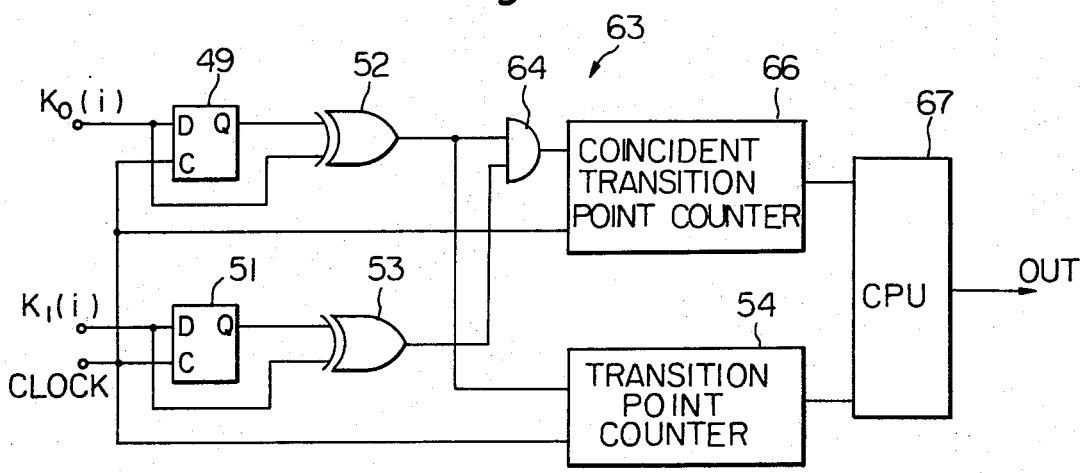
FIG. 8 is a block diagram of a fifth correlation sensing unit of the present invention.

A sensor 58 for performing the fourth method is shown in FIG. 7 and comprises elements as illustrated which are identical to corresponding elements in the sensor 48 and are designated by the same reference numerals. In addition, the sensor 58 comprises transition point distance calculators 59 and 61 having inputs connected to outputs of the exclusive OR gates 52 and 53 respectively and outputs connected to a CPU 62.

Figure 1:
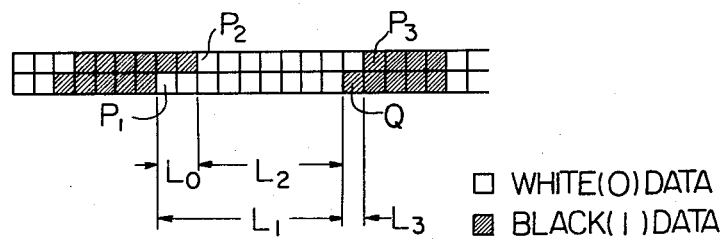
FIG. 1 is a diagram illustrating relative address coding (RAC) in accordance with the present invention.

Preferably, the calculators 59 and 61 calculate distances between transition points utilizing relative address coding (RAC) as disclosed in Japanese patent publication No. 51-30418 and which will be discussed only briefly herein. The RAC system takes advantage of correlation between transition points in the current and preceding scan lines whereas simple coding does not. As illustrated in FIG. 1, Q designates a current transition point and P1 designates a transition point preceding the transition point Q on the current scan line. P2 is the first transition point to the right of the point P1 on the preceding scan line and P3 is the transition point following the transition point P2 on the preceding scan line. The distance between the points Q and P1 is designated as L1. The distance between the transition points Q and P2 is designated as L2. The distance between the transition points Q and P3 is designated as L3. The distance between the transition points P1 and P2 is designated as L0.

In an ordinary coding system the distance L1 between the current transition point Q and the preceding transition point P1 is used in the determination of the correlation coefficient r. However, in the RAC system the transition point distance between the transition point Q and the transition point P1, P2 and P3 having the highest correlation with the transition point Q is selected. In this case, the transition point P3 is used and the transition point distance is L3.

In the sensor 58 the correlation coefficient r is determined as follows:

$$r = 1 - \frac{\text{DIFFERENCE}}{\text{SUM}} \quad (8)$$

In this case, DIFFERENCE represents the difference between the average transition point distances in the current and preceding scan lines respectively. SUM represents the sum of the average transition point distances in the current and preceding scan lines respectively. The average transition point distance for either scan line is computed as follows:

$$L = \sum_{i=1}^{m} l(i)/m \quad (9)$$

The average transition point distance is designated as L. The number of transition points in the scan line is designated as m. The transition point distance for the ith transition point in the scan line is designated as l(i).

FIFTH METHOD

The fifth method not only detects the transition points but detects correlation between transition points on the current and preceding scan lines respectively. A sensor 63 is used to perform the fifth method and comprises like elements which are designated by the same reference numerals used in FIG. 6.

In the sensor 63 the outputs of the exclusive OR gates 52 and 53 are connected to inputs of an AND gate 64, the output of which is connected to an input of a coincident transition point counter 66. The output of the counter 66 is connected to a CPU 67. The AND gate 64 senses coincidence or correlation between transition points on the current and preceding scan lines respectively and the counter 66 counts the correlated transition points.

The fifth method calculates the correlation coefficient r as follows:

$$r = \frac{\text{number of correlated transition points}}{\text{number of transition points on current scan line}} \quad (10)$$

SIXTH METHOD

Figure 9:
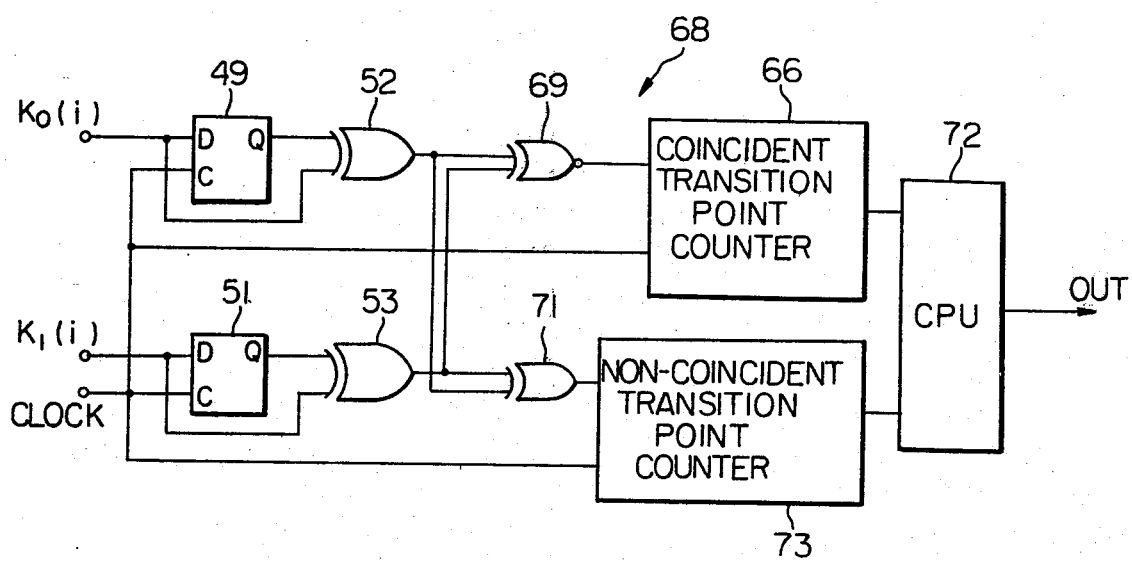
FIG. 9 is a block diagram of a sixth correlation sensing unit of the present invention.

FIG. 9 shows a sensor 68 for embodying the sixth method. The output of the exclusive OR gate 52 is connected to inputs of an exclusive NOR gate 69 and an exclusive OR gate 71. The output of the exclusive OR gate 53 is connected to other inputs of the exclusive NOR gate 69 and exclusive OR gate 71 respectively. The output of the exclusive NOR gate 69 is connected to an input of the coincident transition point counter 66, the output of which is connected to a CPU 72. The output of the exclusive OR gate 71 is connected to an input of a non-coincident transition point counter 73, the output of which is also connected to the CPU 72.

The exclusive NOR gate 69 detects coincidence or correlation between transition points in corresponding positions in the current and preceding scan lines respectively and the counter 66 counts these points. The exclusive OR gate 71 produces a high output whenever the two inputs thereto are different, thereby sensing non-coincidence between transition points. The counter 73 counts the non-coincident transition points.

The correlation coefficient is determined as follows:

$$r = \frac{\text{number of correlated transition points}}{\text{number of non-correlated transition points}} \quad (11)$$

Results of experiments using the fifth method indicate that where the original document is a CCITT No. 1 standard subject copy, one dimensional compression becomes more efficient than two dimensional compression when the correlation coefficient r is less than about 0.3. Where the present apparatus was designed to effect one dimensional compression at a correlation coefficient of $r \leq 0.3$, it was found that the degree of compression was increased by a factor of about 21.6% over standard two dimensional compression. In the tests, the vertical scanning density was four lines per millimeter.

It was heretofore believed that, in order to prevent propogation of error in two dimensional compression, it was advantageous to effect one dimensional compression for every fourth scan line. However, results of tests indicate that using the fifth method of the present invention and automatic reversion to one dimensional scanning when the correlation coefficient r drops below 0.3 that the ratio of two dimensionally compressed to one dimensionally compressed scan lines was about 1:8:1. This gives superior prevention of extension of error than indiscriminate reversion to one dimensional compression for every fourth scan line and increases the compression ratio to a large extent.

In summary, it will be seen that the present invention provides a substantially increased data compression ratio over the prior art while preventing extension of error to subsequent scan lines to an increased extent. Various modifications will become possible for those skilled in the art after receiving the teachings of the present disclosure without departing from the scope thereof. For example, the two dimensional compression system employed may be a mode transition batch processing system such as disclosed in Japanese patent publication no. 51-35329.

What is claimed is:

1. A data compression apparatus for compressing data representing a plurality of scan lines, comprising:
   one dimensional compression means;
   two dimensional compression means;
   sensing means for sensing a degree of correlation between data in a scan line and a preceding scan line; and
   control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
   the sensing means being further constructed to sense when the two dimensional compression means has performed two dimensional compression on the data in a predetermined number of consecutive preceding scan lines and control the one dimensional compression means to perform one dimensional data compression on the data in said scan line in response thereto.

2. An apparatus as in claim 1, in which the one dimensional and two dimensional compression means are constructed to perform run length encoding on the data.

3. An apparatus as in claim 1, in which the sensing means is constructed to sense correlation between logically high data in corresponding positions in said scan line and said preceding scan line respectively.

4. An apparatus as in claim 3, in which the degree of correlation is designated as r and is determined as follows:

$$r = \frac{\text{number of correlated data} - \text{number of uncorrelated data}}{\text{total number of data}}$$

5. An apparatus as in claim 3, in which the degree of correlation is designated as r and is determined as follows:

$$r = \frac{|C(11) - \frac{1}{n} K_0 \cdot K_1|}{\sqrt{K_0 \cdot K_1 (1 - \frac{K_0}{n})(1 - \frac{K_1}{n})}}$$

where $K_0 = 1 + \sum_{i=1}^{n} K_0(i), K_1 = 1 + \sum_{i=1}^{n} K_0(i)$ $$C(11) = 1 + \sum_{i=1}^{n} K_0(i) \cdot K_1(i)$$

and $K_0(i)$ and $K_1(i)$ are data in an ith position in said scan line and said preceding scan line respectively and n is a number of data in each scan line.

6. An apparatus as in claim 1, in which the sensing means is constructed to sense correlation between logical transition points in said scan line and said preceding scan line.

7. An apparatus as in claim 6, in which the degree of correlation is designated as r and is determined as follows:

$$r = 1 - \frac{\text{DIFFERENCE}}{\text{SUM}}$$

where DIFFERENCE is a difference between numbers of transition points in said scan line and said preceding scan line and SUM is a sum of numbers of transition points in said scan line and said preceding scan line respectively.

8. An apparatus as in claim 6, in which the degree of correlation is designated as r and is determined as follows:

$$r = 1 - \frac{\text{DIFFERENCE}}{\text{SUM}}$$

where DIFFERENCE is a difference between average transition point distances in said scan line and said preceding scan line respectively and SUM is a sum of average transition point distances in said scan line and said preceding scan line respectively, the average transition point distances being determined as follows:

$$L = \sum_{i=1}^{m} l(i)/m$$

where L is an average transition point distance, m is a number of transition points and l(i) represents a distance from an ith transition point to a predetermined reference point.

9. An apparatus as in claim 6, in which the degree of correlation is designated as r and is defined as follows:

$$r = \frac{\text{number of correlated transition points}}{\text{number of uncorrelated transition points}}$$

where said number of correlated transition points is a number of transition points in corresponding positions in said scan line and said preceding scan line respectively; and said number of uncorrelated transition points is a number of transition points in said scan line which do not correspond in position to transition points in said preceding scan line.

10. An apparatus as in claim 6, in which the degree of correlation is designated as r and is determined as follows:

$$r = \frac{\text{DIFFERENCE}}{\text{SUM}}$$

where DIFFERENCE is a difference between numbers of transition points in said scan line and said preceding scan line and SUM is a sum of number of transition points in said scan line and said preceding scan line respectively.

11. An apparatus as in claim 6, in which the degree of correlation is designated as r and is determined as follows:

$$r = \frac{\text{number of correlated transition points}}{\text{number of transition points on said scan line}}$$

where said number of correlated transition points is a number of transition points in corresponding positions in said scan and said preceding scan line respectively.

12. An apparatus as in claim 11, in which said predetermined value is substantially r=0.3.

13. A data compression apparatus for compressing data representing a plurality of scan lines, comprising:
one dimensional compression means;
two dimensional compression means;
sensing means for sensing a degree of correlation between data in a scan line and a preceding scan line; and
control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
the sensing means being constructed to sense correlation between logically high data in corresponding positions in said scan line and said preceding scan line respectively;
the sensing means comprising computing means for computing the degree of correlation r as follows:

$$r = \frac{\text{number of correlated data} - \text{number of uncorrelated data}}{\text{total number of data}}$$

14. A data compression apparatus for compressing data representing a plurality of scan lines, comprising:
one dimensional compression means;
two dimensional compression means;
sensing means for sensing a degree of correlation between data in a scan line and a preceding scan line; and
control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
the sensing means being constructed to sense correlation between logically high data in corresponding positions in said scan line and said preceding scan line respectively;
the sensing means comprising computing means for computing the degree of correlation r as follows $$r = \frac{|C(11) - \frac{1}{n} K_0 \cdot K_1|}{\sqrt{K_0 \cdot K_1 (1 - \frac{K_0}{n})(1 - \frac{K_1}{n})}}$$

-continued where $K_0 = 1 + \sum_{i=1}^{n} K_0(i), K_1 = 1 + \sum_{i=1}^{n} K_0(i)$ $C(11) = 1 + \sum_{i=1}^{n} K_0(i) \cdot K_1(i)$ and $K_0(i)$ and $K_1(i)$ are data in an ith position in said scan line and said preceding scan line respectively and n is a number of data in each scan line.

15. A data compression apparatus for compressing data representing a plurality of scan lines, comprising:
   one dimensional compression means;
   two dimensional compression means;
   sensing means for sensing a degree of correlation between data in a scan line and a preceding scan line; and
   control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
   the sensing means being constructed to sense correlation between logical transition points in said scan line and said preceding scan line;
   the sensing means comprising computing means for computing the degree of correlation r as follows $$r = 1 - \frac{\text{DIFFERENCE}}{\text{SUM}}$$

where DIFFERENCE is a difference between numbers of transition points in said scan line and said preceding scan line and SUM is a sum of numbers of transition points in said scan line and said preceding scan line respectively.

16. A data compression apparatus for compressing data representing a plurality of scan lines, comprising:
   one dimensional compression means;
   two dimensional compression means;
   sensing means for sensing a degree of correlation between data in a scan line and a preceding scan line; and
   control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
   the sensing means being constructed to sense correlation between logical transition points in said scan line and said preceding scan line;
   the sensing means comprising computing means for computing the degree of correlation r as follows $$r = 1 - \frac{\text{DIFFERENCE}}{\text{SUM}}$$

where DIFFERENCE is a difference between average transition point distances in said scan line and said preceding scan line respectively and SUM is a sum of average transition point distances in said scan line and said preceding scan line respectively, the average transition point distances being determined as follows:

$$L = \sum_{i=1}^{m} l(i)/m$$

where L is an average transition point distance, m is a number of transition points and l(i) represents a distance from an ith transition point to a predetermined reference point.

17. A data compression apparatus for compressing data representing a plurality of scan lines, comprising:
   one dimensional compression means;
   two dimensional compression means;
   sensing means for sensing a degree of correlation between data in a scan line and a preceding scan line; and
   control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
   the sensing means being constructed to sense correlation between logical transition points in said scan line and said preceding scan line;
   the sensing means comprising computing means for computing the degree of correlation r as follows $$r = \frac{\text{number of correlated transition points}}{\text{number of transition points on said scan line}}$$

where said number of correlated transition points is a number of transition points in corresponding positions in said scan and said preceding scan line respectively.

18. A data compression apparatus for compressing data representing a plurality of scan lines, comprising:
   one dimensional compression means;
   two dimensional compression means;
   sensing means for sensing a degree of correlation between data in a scan line and a preceding scan line; and
   control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;

the sensing means being constructed to sense correlation between logical transition points in said scan line and said preceding scan line;

the sensing means comprising computing means for computing the degree of correlation r as follows $$r = \frac{\text{number of correlated transition points}}{\text{number of uncorrelated transition points}}$$

where said number of correlated transition points is a number of transition points in corresponding positions in said scan line and said preceding scan line respectively; and said number of uncorrelated transition points is a number of transition points in said scan line which do not correspond in position to transition points in said preceding scan line.

19. An apparatus as in claim 18, in which said predetermined value is substantially r=0.3.

20. A data compression apparatus for comprising data representing a plurality of scan lines, comprising:
   one dimensional compression means;
   two dimensional compression means;
   sensing means for sensing a degree of correlation between data in a scan line and a preceding scan line; and
   control means responsive to the sensing means for controlling the two dimensional compression means to perform two dimensional data compression on the data in said scan line when the degree of correlation between the data in said scan line and said preceding scan line is above a predetermined value and for controlling the one dimensional scan means to perform one dimensional data compression on the data in said scan line when the degree of correlation between the data in said scan line and said preceding scan line is below the predetermined value;
   the sensing means being constructed to sense correlation between logical transition points in said scan line and said preceding scan line;
   the sensing means comprising computing means for computing the degree of correlation r as follows $$r = \text{DIFFERENCE/SUM}$$

where DIFFERENCE is a difference between numbers of transition points in said scan line and said preceding scan line and SUM is a sum of number of transition points in said scan line and said preceding scan line respectively.

* * * * *